United States Patent [19]
Priem et al.

[11] Patent Number: 5,038,309
[45] Date of Patent: Aug. 6, 1991

[54] NUMBER CONVERSION APPARATUS

[75] Inventors: Curtis Priem, Fremont; Chris Malachowsky, Santa Clara, both of Calif.

[73] Assignee: Sun Microsystems, Inc., Mountain View, Calif.

[21] Appl. No.: 407,928

[22] Filed: Sep. 15, 1989

[51] Int. Cl.⁵ .................................................. G06F 7/00
[52] U.S. Cl. ................................ 364/715.03; 364/748
[58] Field of Search ........................... 364/715.03, 748; 341/50, 62, 84–85, 104–105

[56] References Cited

U.S. PATENT DOCUMENTS

| | | | |
|---|---|---|---|
| 3,872,442 | 3/1975 | Boles et al. | 364/715.03 X |
| 4,016,560 | 4/1977 | Fowler | 341/84 |
| 4,189,715 | 2/1980 | Duttweiler | 364/715.03 X |
| 4,342,026 | 7/1982 | Hanson | 341/85 X |
| 4,342,027 | 7/1982 | Hanson | 341/85 X |
| 4,376,275 | 3/1983 | Flora | 341/85 |
| 4,430,643 | 2/1984 | Sevilla | 341/85 |
| 4,638,300 | 1/1987 | Miller | 341/85 X |
| 4,719,450 | 1/1988 | Yamauchi | 341/62 |
| 4,792,793 | 12/1988 | Rawlinson et al. | 341/104 X |
| 4,831,575 | 5/1989 | Kuroda | 364/715.03 X |

Primary Examiner—Dale M. Shaw
Assistant Examiner—Tan V. Mai
Attorney, Agent, or Firm—Blakely Sokoloff Taylor & Zafman

[57] ABSTRACT

A first number conversion circuit for converting input numbers in the form of an integer, a floating-point number and a FRACT number into Modulo 256 format for use in connection with a graphic accelerator capable of rapidly manipulating numbers in Modulo 256 format. Also, a second number conversion circuit is disclosed for converting numbers in Modulo 256 format into output numbers in the form of an integer, a floating-point number and a FRACT number after manipulation by the graphic accelerator.

8 Claims, 5 Drawing Sheets

NUMBER CONVERSION APPARATUS

BACKGROUND OF THE INVENTION

1. Field of the Invention

This invention relates to computer systems and, more particularly, to arrangements for converting numbers between formats for use in a matrix arithmetic section of an extremely fast graphics accelerator.

2. History of the Prior Art

In designing computer systems the emphasis is constantly on making such systems faster and able to handle larger amounts of information. Both of these points of emphasis translate directly into the accomplishment of more work. The ability of computers to do more work is also enhanced by their ability to do more different kinds of work. For example, computers have become of use in many new activities with the advent of computer graphics displays which allow the presentation of not only numbers and text materials but pictures representing the meanings of those numbers and adding to the meaning of the text material. The ability to rotate, translate, and scale those pictures has led to the extensive use of the computer in engineering drafting and design. It has gradually become the belief of a great number of people in the computer industry that a graphical output should be presented on almost all computer systems.

Unfortunately, the presentation of a graphics output display by a computer system requires a great deal of the processing power of that system. For example, the presentation of a single frame of graphical material on the computer display of a fairly standard-sized workstation requires that information regarding approximately one thousand pixels in a horizontal direction and approximately one thousand pixels in a vertical direction be stored. Thus, information must be stored which relates to approximately one million pixels for each frame to be displayed. In a system which is capable of providing a number of different colors on the output display, each of those pixels may contain eight bits of digital information regarding the particular pixel. Consequently, approximately eight million bytes of information needs to be handled and stored for each frame to be presented on the output display.

It will be understood that since frames are updated thirty times a second on the output display to create flicker free movement. The total amount of information required to be presented at the output display is a very large number. The simple matter of dealing with such a large amount of information in order to present a graphics output occupies a substantial amount of the time available for a central processing unit (CPU) and may substantially slow the operation of even the fastest of such processors. For this reason, it has become common for computer systems to include graphics accelerators capable of assisting the central processing unit in its operations by taking over some portion of the data processing function relating to the display of graphics on the computer output display. This offloading of some portion of the graphics processing functions from the central processing unit to a graphics accelerator can substantially increase the speed with which any particular computer system is able to process graphics information.

Consequently, attempts are being made to design very fast graphics accelerators. One of the major functions which may be accomplished by a graphics accelerator is to handle the matrix arithmetic necessary for moving graphics images about on the computer output display. Such matrix operations are necessary in handling both two and three-dimensional graphical figures in order to rotate, translate, scale, and otherwise manipulate the particular graphics figures to be displayed on the computer output display.

A graphics accelerator can be very useful in accomplishing these operations because it can relieve the central processing unit of the need to serially recompute various vertices of the figures to be manipulated with each manipulation of the figure to be displayed. A graphics accelerator may accomplish the many operations necessary by means of hardware manipulation of the data and greatly speed the operation of the computer system.

However, a major problem still remains in obtaining extremely rapid operations. This problem derives from the need of a graphics accelerator to manipulate data in a plurality of different number formats. For example, information handled by a central processing unit normally appears in an integer format and must appear in that format when utilized by an output display because a display does not deal in fractions of pixels. On the other hand, many manipulations with very large numbers used in scientific processing require the use of a floating point format. Such numbers must be dealt with in presenting graphics related to such scientific projects. It is clear that such floating point numbers must ultimately be translated into the integer format for presentation on a computer output display.

Additionally, the format described by the acronym FRACT is especially useful in manipulating a particular type of graphics display in a process referred to as shape manipulation. The use of such a computer graphics philosophy is described in co-pending U.S. patent application Ser. No. 07/252,589, entitled METHOD AND APPARATUS FOR IMAGE MANIPULATION, Rocchetti and Donato, filed Oct. 3, 1988, and assigned to the assignee of this invention. The FRACT number system uses an entirely different format than do the integer and floating point number systems.

In prior art computer systems, the central processing unit (CPU) has been called upon to accomplish most number conversions. Thus, although a floating point number may be processed by use of a floating point co-processor, it must ultimately be converted by a processor of the system into integer format so that it may be used in displaying a particular graphical output on a computer output display. The translation of numbers between different number formats by a processor is handled serially and substantially delays the operation of the system. For example, to translate a floating point number to an integer number using the central processing unit, it is necessary to tell the central processing unit the format in which the information is presented, tell the central processing unit the format in which the output is desired, then let the central processing unit refer to a subprocess for converting the number, derive the output of the subprocess, and ultimately use that new number-base system output. It should be obvious to all skilled in the art that this operation substantially slows the operation of any computer system.

SUMMARY OF THE INVENTION

It is, therefore, an object of the present invention to accelerate the operation of a computer system by providing arrangements for rapidly handling the translation of numbers between different number formats in a graphics accelerator utilized with such a computer system.

This and other objects of the present invention are accomplished by a graphics accelerator which comprises a matrix transformation engine including first and second number translating circuits, a first of such circuits including means for translating numbers in integer, floating point, and FRACT formats to numbers stated in Modulo 256 with multiple tap points number format, and the second of such circuits including means for transforming numbers based in Modulo 256 with multiple tap points number format to integer, floating point, and FRACT number formats utilizing conventional matrix transformation operations.

These and other objects and features of the invention will become apparent to those skilled in the art by reference to the following detailed description taken together with the drawings in which like elements are referred to by like designations throughout the several views.

NOTATION AND NOMENCLATURE

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art.

An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus and to method steps for operating a computer in processing electrical or other (e.g. mechanical, chemical) physical signals to generate other desired physical signals.

DETAILED DESCRIPTION OF THE INVENTION

Referring now to FIG. 1 there are shown three number formats which may be utilized in a computer system having a graphics accelerator constructed in accordance with the present invention. The first number format illustrated is the integer format which includes thirty-two bits of twos complement information. The decimal (actually binary) point is assumed to appear to the right of the bit at the extreme right. The integer format is capable of handling numbers from $-2^{31}$ through $2^{31}-1$ in a thirty-two bit format. It will be understood by those skilled in the art that the integer format is capable of handling integers only and does not handle fractions or decimal numbers.

The second format illustrated in FIG. 1 is the so-called FRACT format. In this format, thirty-two bits of storage are provided in a twos complement format. The leftmost sixteen bits in the FRACT format represent binary integers while the rightmost sixteen bits represent fractional parts thereof. While the bits of the integer portion represent positive powers of two beginning at $2^0$ increasing to the left from the binary point, the bits of the fractional portion represent negative powers of two beginning with $2^{-1}$ and increasing in negative power to the right from the point. Using this format, an integer and a fractional portion may be easily represented. The FRACT format is especially useful in manipulating graphics objects for presentation on a computer output display as will be understood from the description provided in the above referred to co-pending patent application.

The third number format illustrated in FIG. 1 is the Institute of Electrical and Electronics Engineers (IEEE) single precision floating point format which provides in its thirty-two bit positions a sign bit to the extreme left, eight bits which are utilized to represent an exponent, and twenty-three bits which are used to represent the unsigned mantissa of a floating point number. In the IEEE representation an additional bit which represents a leading one is presumed to exist at the extreme left of the twenty-three bit mantissa so that the mantissa actually includes twenty-four bits using this representation. The IEEE single precision floating point format may be made to represent numbers from approximately $-2^{128}$ through $2^{127}$.

It will be recognized by those skilled in the art that a process capable of manipulating numbers in the integer format will likely be incapable of manipulating numbers in either the FRACT format or the IEEE single precision format. In like manner, a process capable of manipulating numbers in the FRACT format will likely be incapable of manipulating numbers in the integer format and the IEEE single precision format. Finally, a process capable of manipulating numbers in the IEEE single precision format will likely be incapable of manipulating numbers in the integer format and the FRACT format. It is for this reason that prior art computer systems have, in general, utilized the central processing unit or a floating point co-processor to translate numbers from one format to another prior to manipulation by the graphics accelerator associated with that system. However, as pointed out above, such manipulation substantially slows the operation of the computer system in presenting graphics output displays.

The present invention obviates the need to use the central processing unit to accomplish number translations and thereby speeds the operation of the graphics accelerator appreciably. It accomplishes this by providing a new number format into which each of the three number formats described in FIG. 1 is translated before manipulation by the graphics accelerator. This number format is utilized internally by the transformation engine of the graphics accelerator for accomplishing all the matrix arithmetic operations. Outputs of numbers utilizing this new number format are conveniently provided in each of the integer, FRACT and IEEE single precision floating point formats for further use by the system once manipulations by the transformation engine have been accomplished. The system is also capable of accepting from and furnishing information to external circuitry in the internal format.

Figure 2:
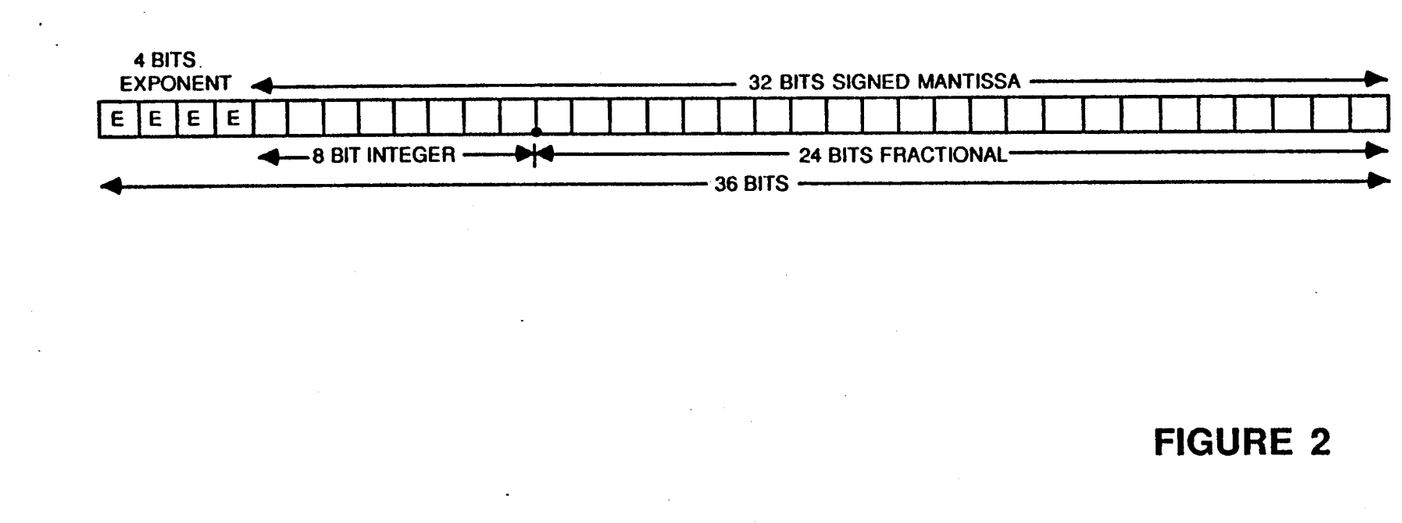
FIG. 2 is an illustration of the Modulo 256 with multiple tap points format used internally by the matrix transformation circuitry of the present invention.

FIG. 2 illustrates this new number format, referred to as the Modulo 256 with multiple tap points number format (hereinafter "Modulo 256"), utilized by the present invention. The format provides thirty-six individual bit positions arranged with the leftmost four bits utilized to represent an exponent, the next eight bits utilized to represent a signed integer component, and the rightmost twenty-four bits utilized to represent a fractional component as in the FRACT number format. This number format is used somewhat differently than any of the other number formats. However, it is readily adaptable to conversion from each of the formats as will be illustrated. Although only four bits are provided for exponents, each increase by one of the exponent is considered to multiply the mantissa by 256 (a shift of eight bits). Moreover, the number of bits available for the mantissa is much larger than with the IEEE single precision format. Thus, a space sufficient to provide for most numbers encountered is provided by the new format.

To read a number represented in the Modulo 256 format, the signed mantissa is multiplied by 256 raised to the power indicated by the four bits of the exponent minus eight (the high order bit of the exponent). The high order bit of the exponent is a one for all positive exponents. The one in the high order bit of the Modulo 256 format allows the easy translation to and from the IEEE format. The need for a one in the high bit position requires that decimal eight be subtracted to reach the correct exponent value, however.

Considering a binary number residing in the mantissa with the binary point positioned as illustrated in FIG. 2. If the four exponent bits are 1000, the binary point remains in its initial position as shown in FIG. 2, eight bits to the right of the least significant exponent bit. If the exponent bits are 1001 indicating an exponent of one, the binary point is effectively moved eight bits to the right of the position shown in FIG. 2. If the exponent is 1010 indicating an exponent of two, the binary point effectively shifts sixteen bits to the right of the position illustrated in FIG. 2.

It is quite easy to transfer between the different conventional number formats and the Modulo 256 format. For example, to translate from the integer format simply requires that the integer number be placed with its least significant bit at the rightmost bit space of the Modulo 256 mantissa space and that the exponent of the Modulo 256 format be set to 1011 (representing an exponent of decimal three). This exponent value effectively displaces the binary point separating the integer and the fractional portions from its normal position of twenty-four bits to the left of the rightmost bit of the mantissa to the extreme right hand end of the mantissa, causing the number stored to represent an integer. The number is then normalized to better fit the bits into the space provided by the Modulo 256 format by moving the binary point as far left as possible in eight bit steps and reducing the exponent by one for each such step. Thus, if the signed integer were to require eight or less bits in total, it would be moved twenty-four bits to the left to fit into the available space and the exponent reduced by three to 1000 so that the binary point would be returned to its normal position in the Modulo 256 format. On the other hand, if the integer were to require nine bits but less than seventeen bits in total, it would be moved only sixteen bits to the left to fit into the available space and the exponent reduced by two to 1001 so that the binary point would be at eight bits to the right of its normal position in the Modulo 256 format.

In order to transfer from the FRACT number format to the Modulo 256 format, it is only necessary that the FRACT number be placed in its normal position with its least significant bit in the rightmost bit space of the Modulo 256 mantissa space and that the Modulo 256 exponent be set to 1001 (increased by one) since this effectively moves the binary point eight bits to the right as described in the discussion regarding FIG. 2. Then, the FRACT number is normalized in the same manner as are integer numbers by moving the integer portion as far left as possible in eight bit steps and reducing the exponent by one for each such step. Thus, if the signed integer portion were to require eight or less bits in total, it would be moved eight bits to the left to fit into the available space and the exponent reduced by one to 1000 so that the binary point would be returned to its normal position in the Modulo 256 format. This is especially advantageous in the FRACT format because it allows the greatest precision to be attained with the space available.

Finally to convert a number expressed in IEEE single precision format to the Modulo 256 format requires that the unsigned mantissa be converted to a signed number and that the number be shifted to adjust for the different exponent bases bits. A different form of normalization is necessary for numbers stated in IEEE single precision floating point format. Such numbers include a mantissa and an exponent; however, the exponent in IEEE format is a power of two. Thus it is necessary to compensate for the difference in the value attributed to the exponent in the floating point format and in the Modulo 256 format. Since each increase of one in the exponent of the floating point number is an increase of a single power of two while each increase of one in the exponent of the Modulo 256 format represents 256 to an additional power, it is necessary to compensate for this difference by moving the binary point in the mantissa. For example, the number $0.1011110 \times 2^{18}$ in floating point format is represented by the number $10.11110 \times 256^2$ in Modulo 256 format. On the other hand, the number $0.1011110 \times 2^6$ in floating point format may be represented by the number $101111.0 \times 256^0$ in Modulo 256 format. In each of these cases, the conversion requires that when the exponent representing a power of two is changed to a power of 256 the binary point in the mantissa be moved. Thus, it is often necessary both to modify the exponent to represent a correct power of 256 and to shift the binary point in the mantissa by a selected number of individual bit places in order to normalize the numbers in translating from IEEE single precision floating point format to Modulo 256 format.

It should be recognized that although only four bits are provided for exponents in the Modulo 256 format while eight bits are provided in the IEEE single precision format, an additional eight bits are provided for the mantissa of the number in Modulo 256 format. Thus, the number expressed provides almost the complete range of IEEE single precision format numbers. More particularly, the numbers which may be expressed in the Modulo 256 format to represent IEEE single precision format numbers run from minus $2^{64}$ through $2^{63}-1$. Although, this omits an entire power of two at each end of the range and is thus less than the IEEE single precision format is capable of expressing, it has been found to be entirely sufficient for expressing numbers utilized in graphic output displays. Moreover, a number may be maintained more precisely while carrying out operations in the Modulo 256 format because of the greater number of bits available in the mantissa.

Figure 3:
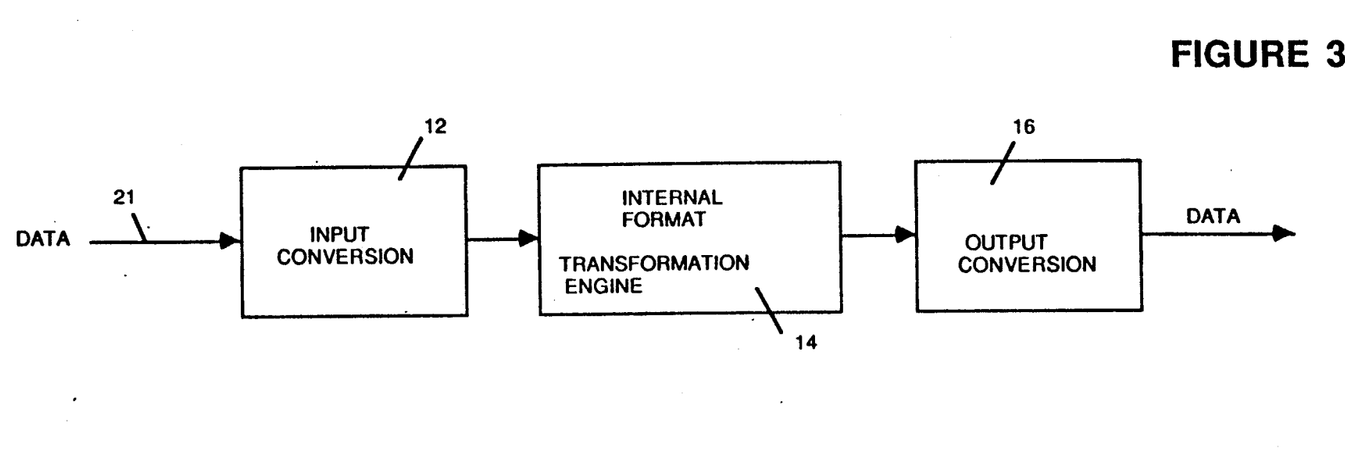
FIG. 3 is a block diagram illustrating the circuitry of the matrix transformation engine of the present invention.

FIG. 3 illustrates in block diagram form the basic arrangement of the circuitry of the present invention. As is illustrated in FIG. 3 inputs are received from a data bus at an input conversion unit 12 representing integers, FRACT, and floating point format numbers. In the system in which the present invention is utilized, integers are directed to an address so that they may be handled by the input conversion unit 12 with the knowledge that they are in that format. In like manner, numbers appearing in the FRACT and floating point input formats, respectively, are directed to addresses so that they are recognized by the input conversion unit 12 as appearing in these formats which are to be converted and normalized in the manner described above for each of those formats.

Figure 4:
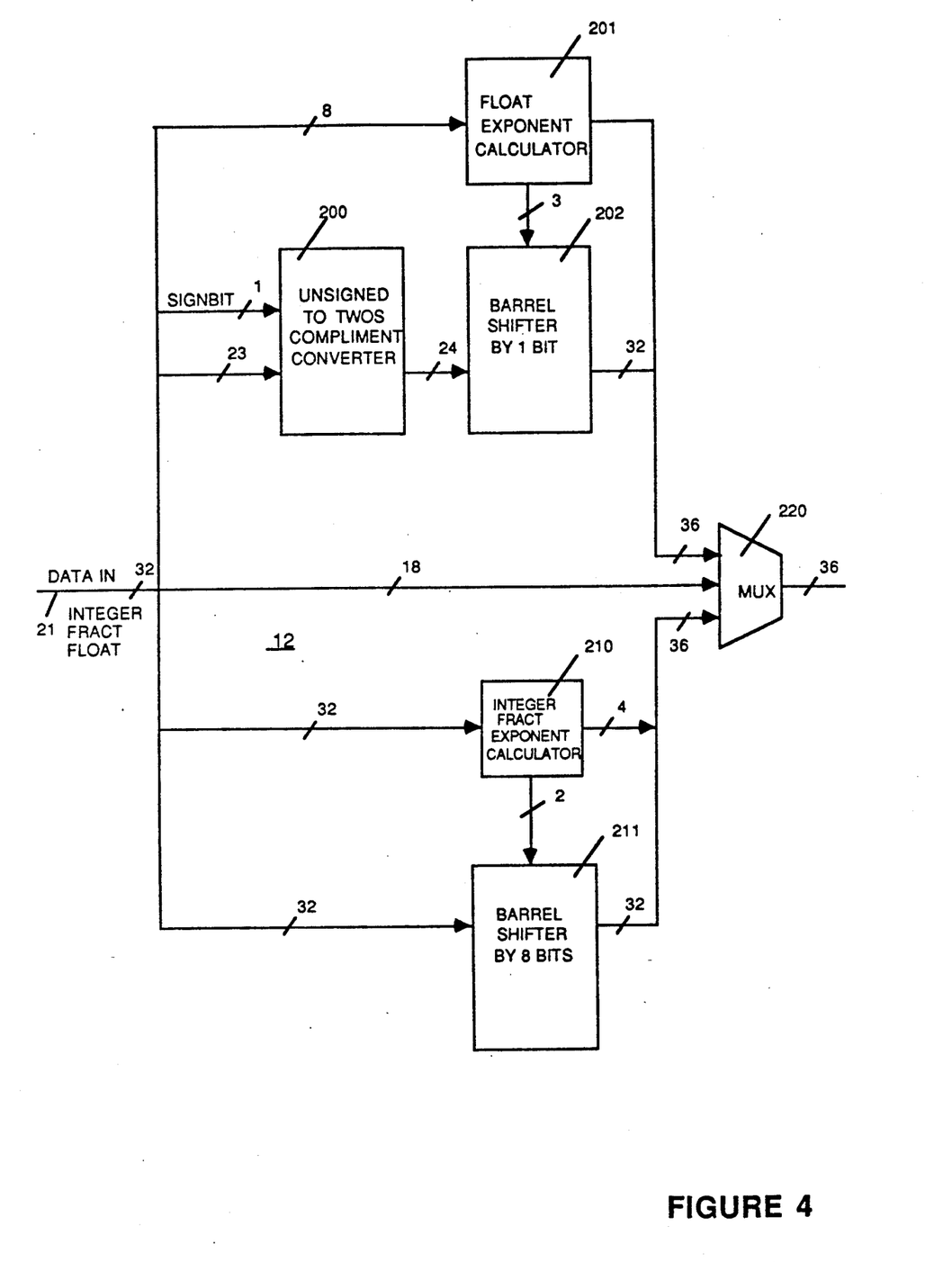
FIG. 4 is a block diagram illustrating the circuitry for accomplishing the input conversion process in the present invention.

The numbers presented to the input conversion unit 12 are translated into the Modulo 256 format and transferred to the transformation engine 14 of the graphics accelerator. FIG. 4 illustrates in block diagram form the circuitry of the input conversion unit 12 for accomplishing this input translation. The circuit 12 illustrated in FIG. 4 includes a data bus 21 upon which the input data in integer, FRACT, or IEEE format is received. The floating point data is transferred to an unsigned-to-twos complement converter 200 and to a floating point exponent calculator 201. The floating point exponent calculator 201 calculates the change in exponents in accordance with the description given above and controls a barrel shifter 202 to shift the mantissa by the correct number of bits in one bit increments so that the numbers in the two formats are equivalent. The floating point calculator produces an exponent for the use in the Modulo 256 format while the barrel shifter 202 produces a signed mantissa. These bits are transferred to a multiplexor 220 for use by the transformation engine 14 illustrated in FIG. 3.

The integer and FRACT data appearing on the data bus 21 are transferred to an integer/FRACT exponent calculator 210 which calculates the appropriate exponent for the number being translated in accordance with the details described above. The calculator 210 provides an appropriate exponent to the multiplexor 220 for the Modulo 256 format and controls an eight bit barrel shifter 211 to provide a mantissa to the multiplexor 220 shifted by the appropriate number of bit positions. Depending on the format being converted, the multiplexor 25 is operated to transfer the appropriate bits and exponent to the transformation engine 14.

The transformation engine 14 manipulates the numbers in accordance with standard matrix formulae well-known in the prior art adapted, however, to the unique number format of this invention and provides output to an output conversion unit 16. The particulars of the circuitry for accomplishing the number transformation are described in co-pending U.S. patent application Ser. No. 07/407,549, entitled APPARATUS FOR MANIPULATING NUMBERS IN A COMPUTER, Priem and Malachowsky, filed on even date herewith. The output conversion unit 16 translates numbers from the Modulo 256 format to each of the integer, FRACT, and floating point formats for further use by the system. For example, the integer format is the format in which numbers must be utilized for storage in the output frame buffer. On the other hand, the FRACT format, the floating point format, and the internal Modulo 256 format may be utilized by the computer system for further operations by that system which do not relate to storage in the frame buffer.

Figure 5:
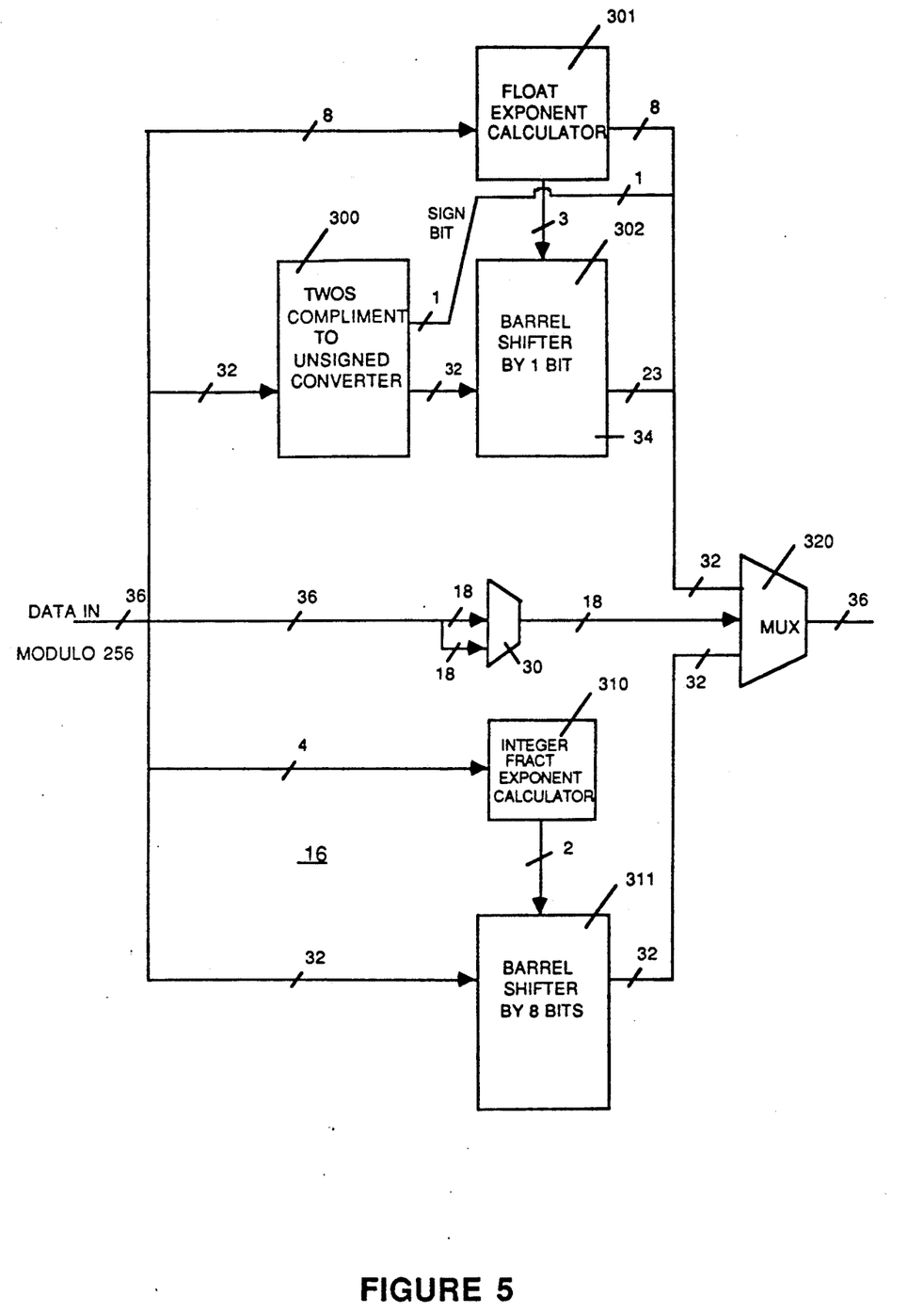
FIG. 5 is a block diagram illustrating the circuitry for accomplishing the output conversion process in the present invention.

FIG. 5 illustrates a circuit used to translate from Modulo 256 number format to integer format, the FRACT format, or the floating point format. The output conversion unit 16 illustrated in FIG. 5 receives data in the Modulo 256 format. If the data is to be used in that format, it is transferred directly to a first multiplexor 303 and therefrom to a second multiplexor 320 for use by other portions of the system. The multiplexor 303 is necessary in order to divide the thirty-six bits of the Modulo 256 format into eighteen bit portions which may be utilized by the system.

If the desired output is to be in the IEEE format, the 32 bits of the signed mantissa are transferred to a twos-complement-to-unsigned converter 300. The sign bit is transferred directly to the multiplexor 320 while the remaining bits are transferred to a barrel shifter 302 which is capable of shifting the mantissa of the Modulo 256 number by a selected number of one bit positions. The number of bit the mantissa is to be shifted is controlled by a float exponent calculator circuit 301 which operates in accordance with the description provided above to normalize the exponents of the two formats and control the shifting of the mantissa by use of the barrel shifter 302. The exponent in IEEE format is transferred from the calculator 301 to the multiplexor 320 while the mantissa, appropriately shifted, is transferred from the shifter 302 to the multiplexor 320.

If the data is to be translated to either the FRACT or integer format, the exponent is transferred to an integer/FRACT exponent controller 310 which calculates the appropriate exponent in the desired format in the manner described above and controls a shifter 311 to shift the mantissa by the appropriate number of eight bit increments to position it correctly. The exponent is transferred by the controller 310 to the multiplexor 320 and the mantissa, appropriately shifted, is transferred from the shifter 311 to the multiplexor 320.

Although the present invention has been described in terms of a preferred embodiment, it will be appreciated that various modifications and alternations might be made by those skilled in the art without departing from the spirit and scope of the invention. The invention should therefore be measured in terms of the claims which follow.

We claim:

1. A number conversion circuit for converting an N-bit input number in a form of an integer, a floating-point, or a FRACT number into an M-bit number in Modulo 256 format with multiple tap points, where M>N, said Modulo 256 format comprising an exponent having at least one exponent bit, and an N-bit mantissa having at least one signed integer bit and at least one fraction bit, said exponent being such that each increase by a value of 1 of said exponent is equivalent to multiplying said mantissa by 256, said number conversion circuit comprising:

integer and FRACT number converting means for converting an integer or a FRACT input number into an equivalent Modulo 256 number format, said FRACT number comprising an integer and a fractional portions, said integer and FRACT number converting means comprising;

aligning means for aligning a least significant bit (LSB) of said input number at a rightmost bit space of said M-bit number in Modulo 256 format;

first shift register for generating a normalized mantissa of said Modulo 256 format by shifting said input number leftward in 8-bit steps; and first exponent calculating means for subtracting a first exponent value in said exponent by 1 for each said 8-bit step, said exponent value being equivalent to shifting a binary point of said integer or FRACT number to be aligned with a binary point of said Modulo 256 format, wherein said first exponent value is a first predetermined value for integer number conversion and a second predetermined value for FRACT number conversion;

floating-point number converting means for converting a floating-point number into an equivalent Modulo 256 format number, said floating-point number comprising a sign bit, an exponent number ("E") representing 2's power and an unsigned mantissa, said floating-point number converting means comprising;

aligning means for aligning a LSB of said integer input number at a rightmost bit space of said M-bit number in Modulo 256 format;

sign-converting means for converting said unsigned mantissa of said floating-point number into a signed mantissa of said Modulo 256 format;

second shift register for generating a normalized mantissa of said Modulo 256 format by shifting said signed mantissa leftward R bits, if E>=8 and R=E−8×F, F being an integer, or shifting said signed mantissa leftward E bits if E<8; and second exponent calculating means for setting said exponent of said Modulo 256 to (F+8) if E>=8, or setting said exponent of said Modulo 256 format to 8 if E<8;

control means for selecting a valid output number in said Modulo 256 format from said integer and FRACT number converting means if an integer number or FRACT number is converted into Modulo 256 format, and floating-point number converting means if a floating-point number is converted into Modulo 256 format;

whereby an output number in said Modulo 256 format is generated.

2. A number conversion circuit according to claim 1, wherein said first shift register of said integer and FRACT number converting means is a barrel shifter by 8 bits.

3. A number conversion circuit according to claim 1, wherein said second shift register of said floating-point number converting means is a barrel shifter by 1 bit.

4. A number conversion circuit according to claim 1, wherein said control means is a multiplexer.

5. A number conversion circuit for converting an M-bit number in Modulo 256 format with multiple tap points into an N-bit output number in a form of an integer, a floating-point, or a FRACT number format, where M>N, said Modulo 256 format comprising an exponent having at least one exponent bit, and an N-bit mantissa having at least one signed integer bit and at least one fraction bit, said exponent bits of said exponent being such that each increase by a value of 1 of said exponent is equivalent to multiplying said mantissa by 256, said number conversion circuit comprising:

integer and FRACT number converting means for converting each number in said Modulo 256 format into an equivalent integer number or an equivalent FRACT number, said number converting means comprising;

first shift register for generating an integer by shifting said mantissa of said Modulo 256 format rightward in 8-bit steps until said exponent of said Modulo 256 format reaches a first exponent value, said exponent value being equivalent to shifting a binary point of said integer or FRACT number to be aligned with a binary point of said Modulo 256 format, wherein said first exponent value is a first predetermined value for integer number conversion and a second predetermined value for FRACT number conversion; and first exponent calculating means for increasing said exponent of said Modulo 256 format by 1 for each of said 8-bit steps, wherein an output number of N bits is generated;

floating-point number converting means for converting each number in said Modulo 256 format into an equivalent floating-point number, said floating-point number comprising a sign bit, an exponent ("E") representing 2's power and an unsigned mantissa, said floating-point number converting means comprising;

sign-converting means for converting said mantissa of said Modulo 256 format into an unsigned mantissa of said floating-point number with said sign bit of said floating-point number;

second shift register for normalizing said unsigned mantissa by shifting said mantissa of said Modulo 256 format rightward, the number of bits thus shifted being "R"; and second exponent calculating means for generating said exponent of said floating-point number by setting said exponent equal to "R" if said exponent ("F") of said Modulo 256 number format equals 8, or setting said exponent equal to (8×(F−8)+R) for F>8, wherein a floating-point number with said sign bit, said exponent equal to E, and said unsigned mantissa is generated;

control means for selecting a valid output from said integer and FRACT number converting means if an integer output or FRACT output is desired and floating-point number converting means if a floating-point number is desired.

6. A number conversion circuit according to claim 5, wherein said first shift register of said integer and FRACT number converting means is a barrel shifter by 8 bits.

7. A number conversion circuit according to claim 5, wherein said control means is a multiplexer.

8. A number conversion circuit according to claim 5, wherein said second shift register of said floating-point number converting means is a barrel shifter by 1 bit.

* * * * *

UNITED STATES PATENT AND TRADEMARK OFFICE
CERTIFICATE OF CORRECTION

PATENT NO. : 5,038,309
DATED : August 6, 1991
INVENTOR(S) : Curtis Priem

Figure 1A:
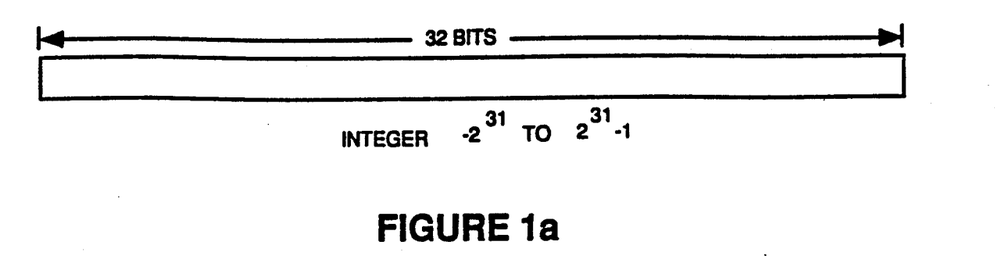
FIG. 1 is an illustration of three number formats which may be utilized with the graphics accelerator associated with the present invention.
Figure 1B:
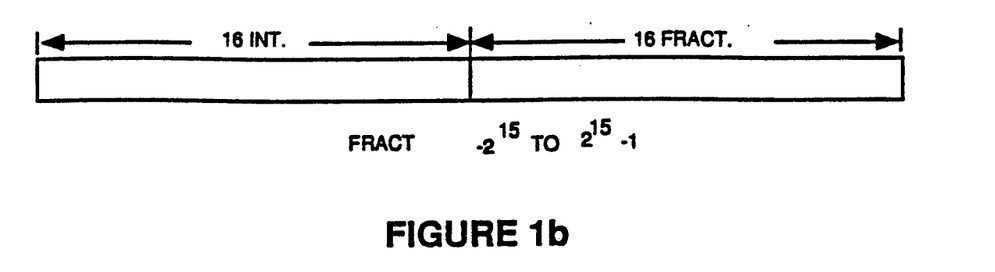
Figure 1C:
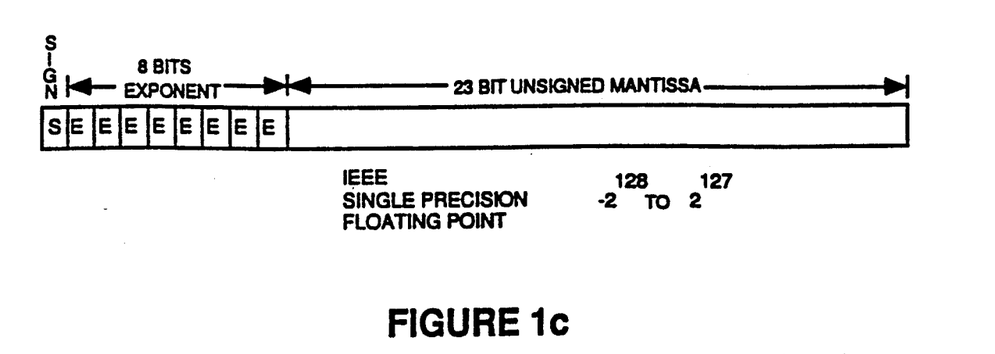

It is certified that error appears in the above-indentified patent and that said Letters Patent is hereby corrected as shown below:

In column 3 at line 24, please delete " FIG.1 is an illustration " and insert -- FIGS. 1a, 1b and 1c are illustrations --.

In column 4 at line 14, please delete " FIG. 1 " and insert " FIGS. 1a, 1b and 1c, --.

In column 4 at line 17-18, please delete " The first number format " and insert -- 1a --.

In column 4 at line 18, please delete the word " illustrated ".

In column 4 at line 27, please delete " The second format illustrated in FIG. 1 " and insert -- 1b --.

In column 4 at line 44, please delete " The third number format illustrated in FIG. 1 " and insert -- 1c --.

In column 5 at line 14, please delete " FIG. 1 " and insert -- FIGS. 1a, 1b, and 1c --.

Signed and Sealed this

Sixteenth Day of September, 1997

Attest:

BRUCE LEHMAN

*Attesting Officer*   *Commissioner of Patents and Trademarks*